(12) United States Patent
Kim et al.

(10) Patent No.: US 9,379,689 B2
(45) Date of Patent: Jun. 28, 2016

(54) INTEGRATED CIRCUIT

(71) Applicant: SK hynix Inc., Gyeonggi-do (KR)

(72) Inventors: Seong-Jin Kim, Gyeonggi-do (KR); Sung-Soo Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/569,140

(22) Filed: Dec. 12, 2014

(65) Prior Publication Data

US 2016/0020754 A1    Jan. 21, 2016

(30) Foreign Application Priority Data

Jul. 18, 2014   (KR) .................. 10-2014-0091200

(51) Int. Cl.
*H03K 3/356*   (2006.01)
*H03K 3/013*   (2006.01)

(52) U.S. Cl.
CPC .......... *H03K 3/013* (2013.01); *H03K 3/356104* (2013.01)

(58) Field of Classification Search
USPC ......... 327/115, 116, 117, 118, 199, 355–360, 327/202, 203, 208–215, 218; 377/47, 48
See application file for complete search history.

(56) References Cited

U.S. PATENT DOCUMENTS

| | | | | |
|---|---|---|---|---|
| 7,719,304 B1* | 5/2010 | Clark | ................. | H03K 3/0372 326/14 |
| 8,178,903 B2* | 5/2012 | Nakamura | .......... | H01L 27/0207 257/206 |
| 2008/0180153 A1* | 7/2008 | Sachdev | ............. | G11C 11/4125 327/208 |
| 2009/0121765 A1* | 5/2009 | Yamamoto | ....... | H03K 3/356191 327/208 |
| 2009/0184733 A1* | 7/2009 | Lilja | .................. | G06F 17/5068 326/101 |
| 2009/0219752 A1* | 9/2009 | Wissel | ............... | G11C 11/4125 365/154 |
| 2009/0295448 A1* | 12/2009 | Guo | ................. | H03K 3/356139 327/211 |
| 2010/0084689 A1* | 4/2010 | Nakamura | ............ | H01L 27/092 257/206 |
| 2012/0180005 A1* | 7/2012 | Lilja | .................. | G06F 17/5068 716/50 |
| 2014/0157223 A1* | 6/2014 | Lilja | .................. | G06F 17/5068 716/138 |

FOREIGN PATENT DOCUMENTS

KR    1020120078199    7/2012

* cited by examiner

*Primary Examiner* — Brandon S Cole
(74) *Attorney, Agent, or Firm* — IP&T Group LLP

(57) ABSTRACT

An integrated circuit includes a latch block suitable for storing a signal through four or more even-numbered coupling lines inverted and driven alternately with each other, wherein the coupling lines are divided into two or more coupling line groups each including coupling lines inverted and driven to the same logic level, and a charge buffer block coupled between two or more coupling lines included in one of the coupling line groups and suitable for slowing down a charge movement speed therebetween.

7 Claims, 4 Drawing Sheets

INTEGRATED CIRCUIT

CROSS-REFERENCE TO RELATED APPLICATIONS

The present application claims priority of Korean Patent Application No. 10-2014-0091200, filed on Jul. 18, 2014, which is incorporated herein by reference in its entirety.

BACKGROUND

1. Field

Exemplary embodiments of the present invention relate to a semiconductor design technology, and more particularly, to an integrated circuit including a latch circuit suitable for latching an input signal.

2. Description of the Related Art

An integrated circuit may include diverse structures of circuits for latching an input signal.

FIG. 1 is a circuit diagram illustrating a structure of a circuit for latching an input signal in a conventional integrated circuit.

Referring to FIG. 1, the circuit for latching an input signal IN in the integrated circuit includes two inverters INV1 and INV2.

An input terminal of the first inverter INV1 and an output terminal of the second inverter INV2 are coupled with each other, and an output terminal of the first inverter INV1 and an input terminal of the second inverter INV2 are coupled with each other. Therefore, logic levels of an input node IN and an output node OUT are in a complementary relationship to each other.

For example, when the input node IN is in an electric potential of a high logic level, the output node OUT is stable in an electric potential of a low logic level. On the contrary, when the input node IN is in an electric potential of a low logic level, the output node OUT is stable in an electric potential of a high logic level. A latch circuit formed of the inverters INV1 and INV2 has two different and stable logic states depending on the high or low logic state of the input node IN and the output node OUT. The logic states are held as they are.

The latch circuit formed of the inverters INV1 and IN2 is very stable, and noise has not been a matter of concern.

However, as the latch circuit is exposed to radiation with ionization characteristics, it is influenced by generated electric charges. That is, radioactive rays are emitted into the latch circuit so that the memory state of the latch circuit becomes unstable, and the possibility of malfunctions, such as an inversion of the memory state increases.

This phenomenon is referred to as a soft error, which is caused by an alpha($\alpha$)-ray emitted from package materials or wiring materials.

Particularly, soft errors occur more easily as power supply voltage is lowered. For this reason, in a semiconductor memory device which is driven by a low voltage power supply, an important theme is how to increase tolerance to soft errors.

SUMMARY

Exemplary embodiments of the present invention are directed to an integrated circuit including a latch circuit that is resistant to soft errors.

In accordance with an embodiment of the present invention, an integrated circuit includes a latch block suitable for storing a signal through four or more even-numbered coupling lines inverted and driven alternately with each other, wherein the coupling lines are divided into two or more coupling line groups each including coupling lines inverted and driven to the same logic level, and a charge buffer block coupled between two or more coupling lines included in one of the coupling line groups and suitable for slowing down charge movement speed therebetween.

DETAILED DESCRIPTION

Figure 1:
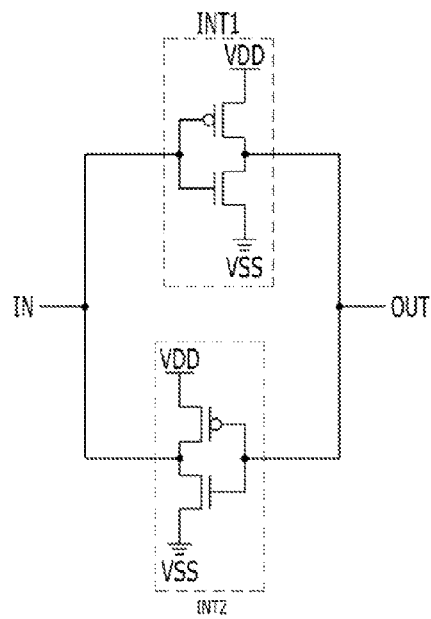
FIG. 1 is a circuit diagram illustrating a structure of a circuit for latching an input signal in a conventional integrated circuit.

Exemplary embodiments of the present invention are described below in more detail with reference to the accompanying drawings. These embodiments are provided so that this disclosure is thorough and complete, and fully conveys the scope of the present invention to those skilled in the art. All "embodiments" referred to in this disclosure refer to embodiments of the inventive concept disclosed herein. The embodiments presented are merely examples and are not intended to limit the inventive concept.

The drawings are not necessarily to scale and in some instances, proportions may have been exaggerated in order to clearly illustrate features of the embodiments. Throughout the disclosure, like reference numerals correspond directly to the like parts in the various figures and embodiments of the present invention.

It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
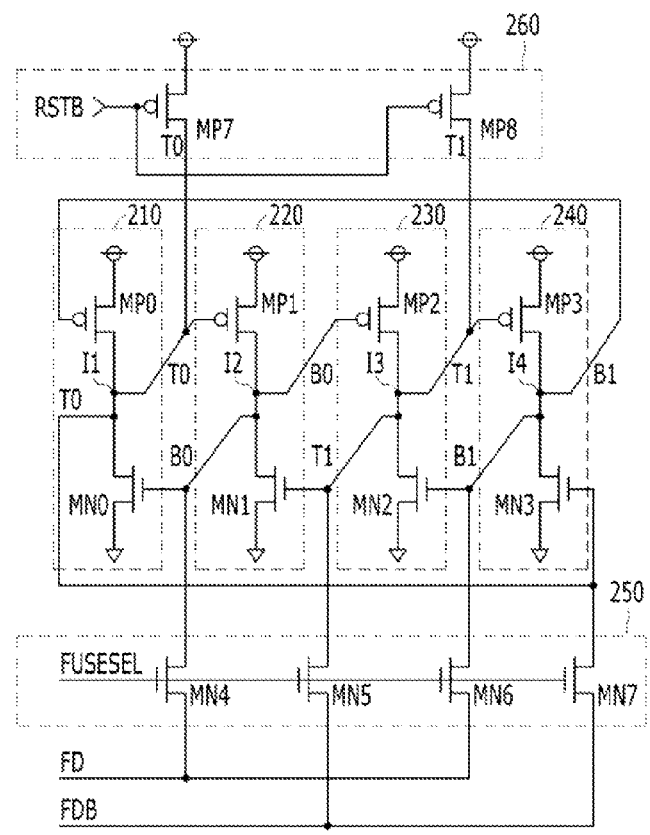
FIG. 2 is a circuit diagram illustrating a structure of a DICE latch.

FIG. 2 is a circuit diagram illustrating a structure of a DICE latch.

Figure 3:
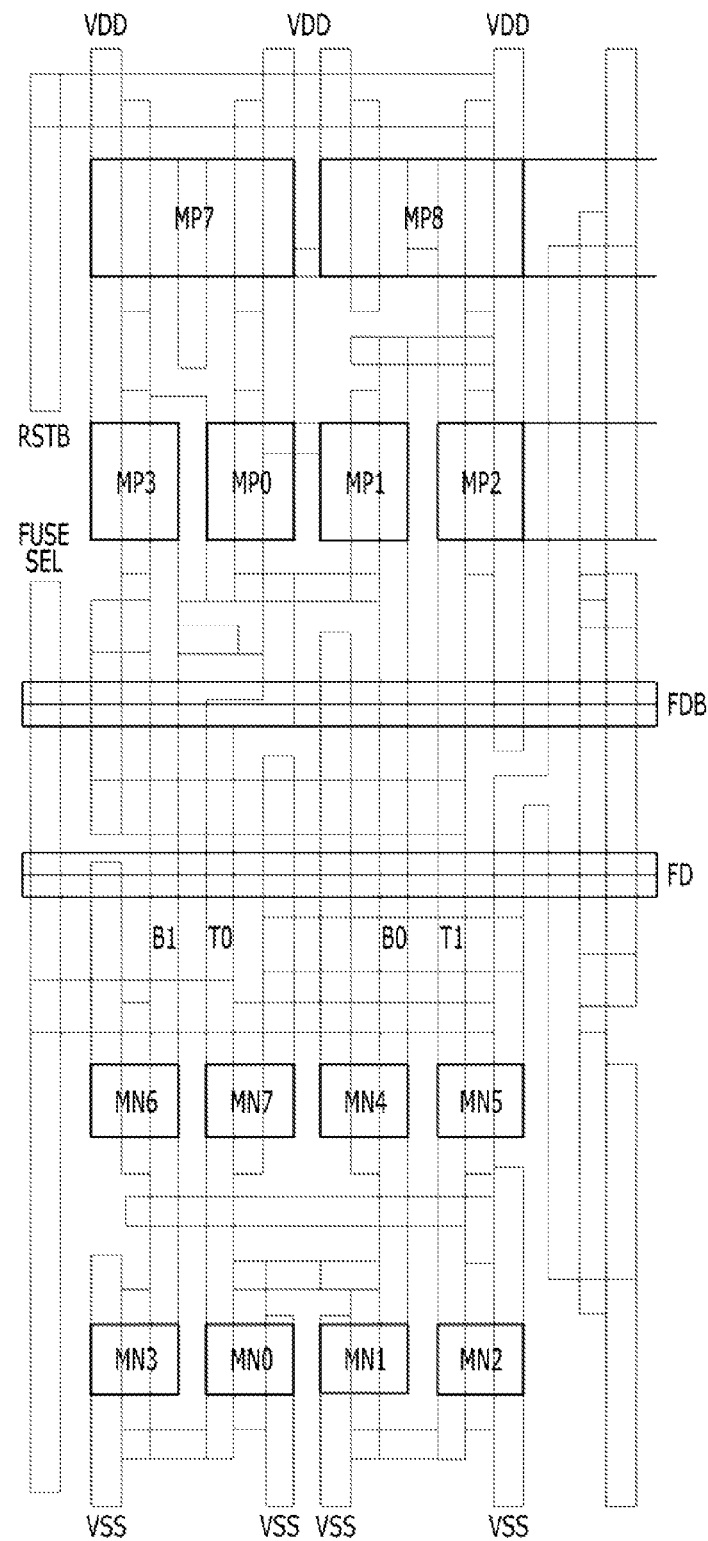
FIG. 3 is a diagram showing a layout of the DICE latch shown in FIG. 2.

FIG. 3 is a diagram showing a layout of the DICE latch shown in FIG. 2.

The DICE latch includes latch blocks 210, 220, 230 and 240, an input control block 250, and an initialization control block 260. The latch blocks 210, 220, 230 and 240 include four or more even-numbered transistor groups 210, 220, 230 and 240 and four or more even-numbered coupling lines T0, B0, T1 and B1.

The latch blocks 210, 220, 230 and 240 store signals through the coupling lines T0, B0, T1 and B1 which are inverted and driven alternately with each other.

The transistor groups 210, 220, 230 and 240 include PMOS transistors MP0, MP1, MP2 and MP3 and NMOS transistors MN0, MN1, MN2 and MN3, which are coupled in series with each other on both sides of coupling nodes I1, I2, I3 and I4 between a power supply voltage (VDD) terminal and a ground voltage (VSS) terminal, respectively.

The coupling lines T0, B0, T1 and B1 couple the transistor groups 210, 220, 230 and 240 with each other in a loop shape (... 240→210→220→230→240→210→ ... ). The coupling lines T0, B0, T1 and B1 couple the respective coupling nodes I1, I2, I3 and I4 included in the transistor groups 210, 220, 230 and 240 with gates of the NMOS transistors MN3, MN0, MN1 and MN2 included in the front transistor groups 240, 210, 220 and 230 of the respective transistor groups 410, 420, 430, and 440. Also, the coupling lines T0, B0, T1 and B1 couple the respective coupling nodes I1, I2, I3 and I4 included in the transistor groups 210, 220, 230 and 240 with the PMOS transistors MP1, MP2, MP3 and MP0 included in the back transistor groups 220, 230, 240 and 210 of the respective transistor groups 410, 420, 430, and 440.

The coupling lines T0, B0, T1 and B1 are divided into two coupling line groups T0/T1 and B0/B1 which are inverted and driven alternately with each other. The coupled lines of each coupling line group have the same logic level. For example, when the two odd-numbered coupling lines T0 and T1 among the coupling lines T0, B0, T1 and B1 belong to the first coupling line group T0/T1 and they are in a high logic level, the two even-numbered coupling lines B0 and B1 belong to the second coupling line group B0/B1 and they are in a low logic level. In contrast, when the first coupling line group T0/T1 is in a low logic level, the second coupling line group B0/B1 is in a high logic level.

The initialization control block 260 initializes an operation of the DICE latch in response to an initialization operation control signal RSTB. To this end, the initialization control block 260 uses a method for controlling a coupling of two or more coupling lines included in one of the coupling line groups T0/T1 and B0/B1 and the power supply voltage (VDD) terminal or the ground voltage (VSS) terminal in response to the initialization operation control signal RSTB. In other words, the initialization control block 260 may control a coupling of two or ore coupling lines included in the first coupling line group T0/T1 and the power supply voltage (VDD) terminal or the ground voltage (VSS) terminal, or may control a coupling of two or more coupling lines included in the second coupling line group B0/B1 and the power supply voltage (VDD) terminal or the ground voltage (VSS) terminal, in response to the initialization operation control signal RSTB.

For example, it may be seen that the initialization control block 260 shown in FIG. 2 couples two coupling lines included in the first coupling line group T0/T1 to the power supply voltage (VDD) terminal in response to the initialization operation control signal RSTB. In other words, the initialization control block 260 shown in FIG. 2 includes two PMOS transistors MP7 and MP8 whose drain terminals are coupled with the coupling lines included in the first coupling line group T0/T1, respectively, and source terminals are coupled with the power supply voltage (VDD) terminals, respectively, and gate terminals receive the initialization operation control signal RSTB.

As shown in FIG. 3, the PMOS transistors MP7 and MP8 included in the initialization control block 260 are not only disposed dose to the PMOS transistors MP0, MP1, MP2 and MP3 included in the transistor groups 210, 220, 230 and 240 but also have similar coupling shapes to each other. Therefore, the PMOS transistors MP7 and MP8 included in the initialization control block 260 are generally formed in the same active region as the PMOS transistors MP0, MP1, MP2 and MP3 included in the transistor groups 210, 220, 230 and 240.

The input control block 250 performs an operation inputting predetermined signals FD and FDB to a plurality of latches in response to an input operation control signal FUSESEL. To this end, the input control block 250 uses a method for controlling a coupling of two or more coupling lines included in one of the coupling line groups T0/T1 and B0/B1 and a predetermined main signal (FD) input terminal controlling a coupling of two or more coupling lines included in the other of the coupling line group T0/T1 and B0/B1 and a predetermined sub signal (FDB) input terminal, in response to the input operation control signal FUSESEL.

For example, it may be seen that the input control block 250 shown in FIG. 2 couples two coupling lines included in the first coupling line group T0/T1 to the predetermined sub signal (FDB) input terminal and couples two coupling lines included in the second coupling line group B0/B1 to the predetermined main signal (FD) input terminal. In other words, the input control block 250 shown in FIG. 2 includes four NMOS transistors MN4 to MN7. The two NMOS transistors MN5 and MN7 have drain terminals coupled with the coupling lines included in the first coupling line group T0/T1, respectively, source terminals coupled with the predetermined sub signal (FDB) input terminal, and gate terminals receiving the input operation control signal FUSESEL. Two NMOS transistors MN4 and MN6 have drain terminals coupled with the coupling lines included in the second coupling line group B0/B1, respectively, source terminals coupled with the predetermined main signal (FD) input terminal, and gate terminals receiving the input operation control signal FUSESEL.

As shown in FIG. 3, the NMOS transistors MN4, MN5, MN6 and MN7 included in the input control block 250 are not only disposed in a position close to the NMOS transistors MN0, MN1, MN2 and MN3 included in the transistor groups 210, 220, 230 and 240 but also have similar coupling shapes to each other. Therefore, the NMOS transistors MN4, MN5, MN6 and MN7 included in the input control block 250 are generally formed in the same active region as the NMOS transistors MN0, MN1, MN2 and MN3 included in the transistor groups 210, 220, 230 and 240.

Although the DICE latch having the above described structure is exposed to radiation and electric charges are generated to exceed a threshold charge amount in one coupling node included in one of the transistor groups 210 to 240 (for example, the coupling node I1), the excess electric charges may not spread to the coupling nodes included in the front and back transistor groups thereof (for example, the coupling nodes I4 and I2). That is, it is difficult in the described structure of the DICE latch to spread an error state among the transistor groups. Therefore, the aforementioned DICE latch has strong tolerance to soft errors compared with the conventional latch shown in FIG. 1.

However, the initialization control block 260 included in the DICE latch as described above is not only disposed in the active region as the PMOS transistors MP0, MP1, MP2 and MP3 included in four or more even-numbered transistor groups 210, 220, 230 and 240, but also initializes a logic level of the signal stored in the DICE latch in response to the initialization operation control signal RSTB transmitted through one line. The one line may also be disposed in the active region of the PMOS transistors MP0, MP1, MP2 and MP3 included in the transistor groups 210 to 240. Therefore, when electric charges are generated to exceed a threshold charge amount in the coupling node included in one of the transistor groups 210 to 240, the excess electric charges may spread throughout the one line and the initialization operation control signal RSTB may be enabled to initialize the DICE latch.

Although it is described in the embodiments of the present invention that signals are stored in the DICE latch through four coupling lines T0, B0, T1 and B1, signals may be stored through more even-numbered coupling lines such as 6 coupling lines and 8 coupling lines, depending on how the circuits are designed. When the number of the coupling lines increases to 6 or 8, transistor groups may be further included to invert the signals between the coupling lines.

Figure 4:
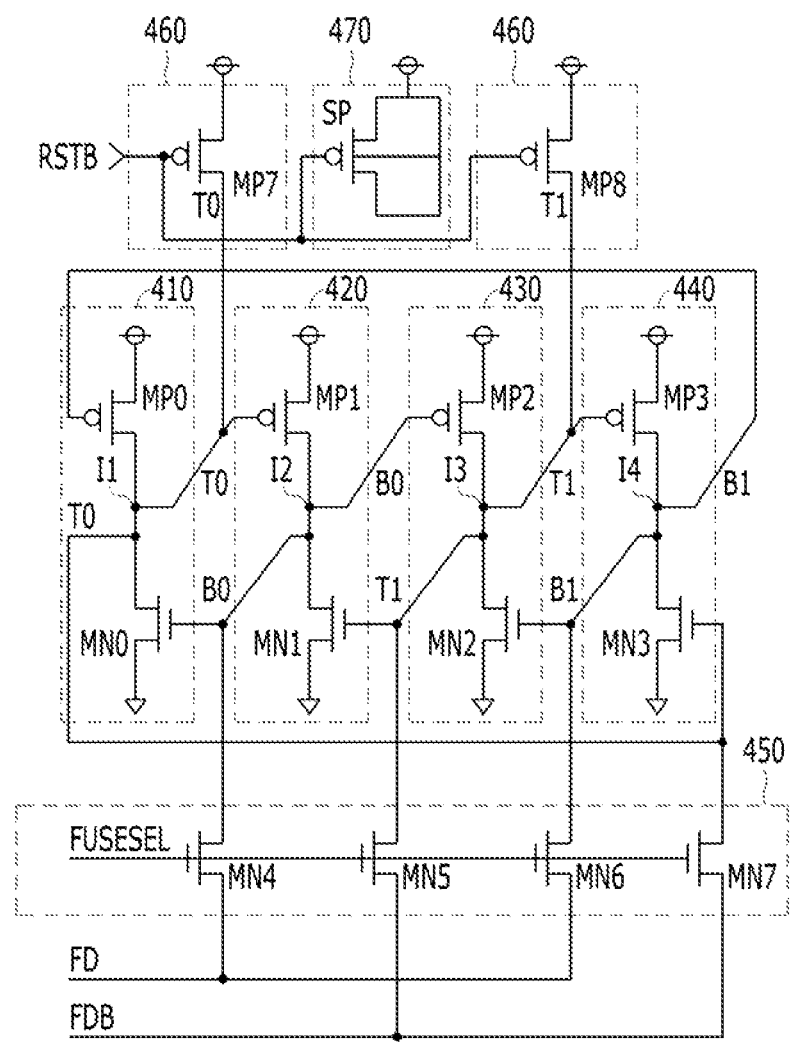
FIG. 4 is a circuit diagram illustrating a structure of a DICE latch in accordance with an embodiment of the present invention.

FIG. 4 is a circuit diagram illustrating a structure of a DICE latch in accordance with an embodiment of the present invention.

Figure 5:
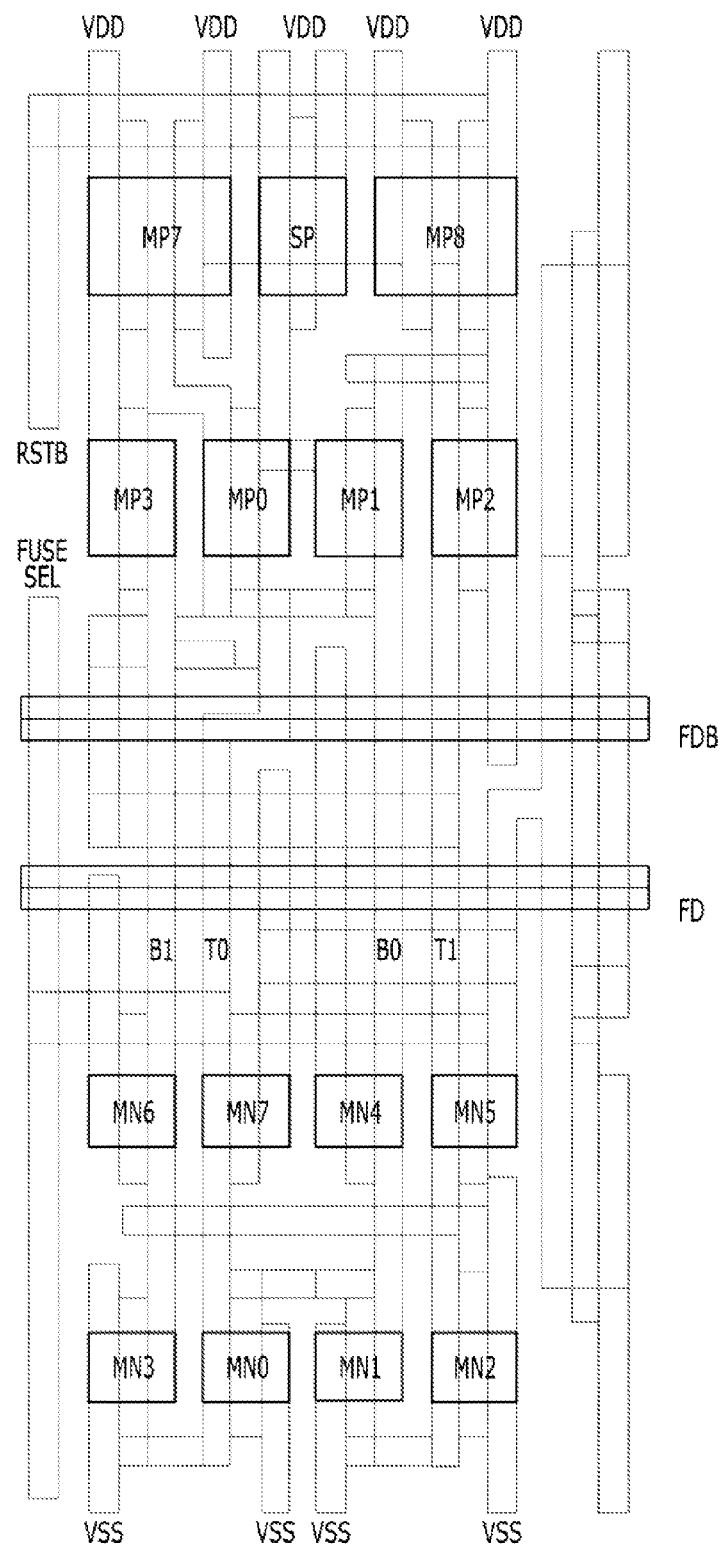
FIG. 5 is a diagram showing a layout of the DICE latch shown in FIG. 4.

FIG. 5 is a diagram showing a layout of the DICE latch shown in FIG. 4.

Referring to FIG. 4, the DICE latch includes latch blocks 410, 420, 430 and 440, a charge buffer block 470, an input control block 450, and an initialization control block 460. The latch blocks 410, 420, 430 and 440 include four or more even-numbered transistor groups 410, 420, 430 and 440 and four or more even-numbered coupling lines T0, B0, T1 and B1.

The latch blocks 410, 420, 430 and 440 store signals through the coupling lines T0, B0, T1 and B1 which are inverted and driven alternately with each other.

The transistor groups 410, 420, 430 and 440 include PMOS transistors MP0, MP1, MP2 and MP3 and NMOS transistors MN0, MN1, MN2 and MN3, which are coupled in series with each other on both sides of coupling nodes I1, I2, I3 and I4 between a power supply voltage (VDD) terminal and a ground voltage (VSS) terminal, respectively.

The coupling lines T0, B0, T1 and B1 couple the transistor groups 410, 420, 430 and 440 with each other in a loop shape (... 440→410→420→430→440→410→ ...). The coupling lines T0, B0, T1 and B1 couple the respective coupling nodes I1, I2, I3 and I4 included in the transistor groups 410, 420, 430 and 440 with gates of the NMOS transistors MN3, MN0, MN1 and MN2 included in the front transistor groups 440, 410, 420 and 430 of the respective transistor groups 410, 420, 430, and 440. Also, the coupling lines T0, B0, T1 and B1 couple the respective coupling nodes I1, I2, I3 and I4 included in the transistor groups 410, 420, 430 and 440 with the PMOS transistors MP1, MP2, MP3 and MP0 included in the back transistor groups 420, 430, 440 and 410 of the respective transistor groups 410, 420, 430, and 440.

The coupling lines T0, B0, T1 and B1 are divided into two coupling line groups T0/T1 and B0/B1, which are inverted and driven alternately with each other. The coupled lines of each coupling line group have the same logic level. For example, when the two odd-numbered coupling lines T0 and T1 among the coupling lines T0, B0, T1 and B1 belong to the first coupling line group T0/T1 and they are in a high logic level, the two even-numbered coupling lines B0 and B1 belong to the second coupling line group B0/B1 and they are in a low logic level. In contrast, when the first coupling line group T0/T1 is a low logic level, the second coupling line group B0/B1 is in a high logic level.

The initialization control block 460 controls initialization of the DICE latch in response to an initialization operation control signal RSTB. To this end, the initialization control block 460 uses a method for controlling a coupling of two or more coupling lines included in one of the coupling line groups T0/T1 and B0/B1 and the power supply voltage (VDD) terminal or the ground voltage (VSS) terminal in response to the initialization operation control signal RSTB. In other words, the initialization control block 460 may control a coupling of two or more coupling lines included in the first coupling line group T0/T1 and the power supply voltage (VDD) terminal or the ground voltage (VSS) terminal, or may control a coupling of two or more coupling lines included in the second coupling line group B0/B1 and the power supply voltage (VDD) terminal or the ground voltage (VSS) terminal, in response to the initialization operation control signal RSTB.

For example, it may be seen that the initialization control block 450 shown in FIG. 4 couples two coupling lines included in the first coupling line group T0/T1 to the power supply voltage (VDD) terminal in response to the initialization operation control signal RSTB. In other words, the initialization control block 460 shown in FIG. 4 includes two PMOS transistors MP7 and MP8 whose drain terminals are coupled with the coupling lines included in the first coupling line group T0/T1, respectively, and source terminals are coupled with the power supply voltage (VDD) terminals, respectively, and gate terminals receive the initialization operation control signal RSTB.

In contrast to FIG. 4, the initialization control block 460 may couple two coupling lines included in the first coupling line group T0/T1 to the ground voltage (VSS) terminal in response to the initialization operation control signal RSTB. In other words, the initialization control block 460 may include two NMOS transistors (not shown) whose drain terminals are coupled with the coupling lines included in the first coupling line group T0/T1, respectively, and source terminals are coupled with the ground voltage (VSS) terminals, respectively, and gate terminals receive the initialization operation control signal RSTB.

The charge buffer block 470 slows down charge migration speed while being coupled between two or more coupling lines included in one of the coupling line groups T0/T1 and B0/B1.

For example, when the initialization control block 460 shown in FIG. 4 includes the PMOS transistors MP7 and MP8, the charge buffer block 470 is coupled with gate terminals of the PMOS transistors MP7 and MP8 included in the initialization control block 460 and slows down charge migration speed in the line transmitting the initialization operation control signal RSTB. To this end, the charge buffer block 470 may include a PMOS transistor SP of a capacitor shape whose gate terminal is coupled with the gate terminals of the PMOS transistors MP7 and MP8 included in the initialization control block 460 shown in FIG. 4 and source terminals and drain terminals are coupled with the power supply voltage (VDD) terminal. Different from what is shown in FIG. 4, the charge buffer block 470 may include a capacitor with one side coupled with the gate terminals of the PMOS transistors MP7 and MP8 included in the initialization control block 460 and another side coupled with the power supply voltage (VDD) terminal.

Different from what is shown in FIG. 4, when the initialization control block 460 includes two NMOS transistors (not shown), the charge buffer block 470 is coupled with gate terminals of the NMOS transistors included in the initialization control block 460 and slows down charge migration speed in the line transmitting the initialization operation control signal RSTB. To this end, the charge buffer block 470 may include an NMOS transistor (not shown) of a capacitor shape whose gate terminal is coupled with the gate terminals of the NMOS transistors included in the initialization control block 460 and source terminal and drain terminals are coupled with the ground voltage (VSS) terminal. The charge buffer block 470 may include a capacitor with one side coupled with the gate terminals of the NMOS transistors included in the initialization control block 460 and another side coupled with the ground voltage (VSS) terminal.

As shown in FIG. 5, the PMOS transistors MP7 and MP8 included in the initialization control block 460 and the PMOS transistor SP included in the charge buffer block 470 are not only disposed close to the PMOS transistors MP0, MP1, MP2 and MP3 included in the transistor groups 410, 420, 430 and 440 but also have similar coupling shapes to each other. Therefore, the PMOS transistors MP7 and MP8 included in the initialization control block 460 and the PMOS transistor SP included in the charge buffer block 470 are formed in the same active region as the PMOS transistors MP0, MP1, MP2 and MP3 included in the transistor groups 410, 420, 430 and 440. Even when the capacitor (not shown), instead of the PMOS transistor, SP is included in the charge buffer block 470, the capacitor may be formed in the same active region as the PMOS transistors MP0, MP1, MP2 and MP3 included in the transistor groups 410, 420, 430 and 440.

Different from what is shown in FIG. 5, even when the two NMOS transistors (not shown) are included in the initialization control block 460 and the NMOS transistor (not shown) or the capacitor (not shown) is included in the charge buffer block 470, they are not only disposed dose to the NMOS transistors MN0, MN1, MN2 and MN3 included in the transistor groups 410, 420, 430 and 440 but also have similar coupling shapes to each other. Therefore, the NMOS transistors (not shown) included in the initialization control block 460 and the NMOS transistor (not shown) or the capacitor (not shown) included in the charge buffer block 470 are formed in the same active region as the NMOS transistors MN0, MN1, MN2 and MN3 included in the transistor groups 410, 420, 430 and 440.

The input control block 450 performs an operation for inputting predetermined signals FD and FDB to a plurality of latches in response to an input operation control signal FUSESEL. To this end, the input control block 450 uses a method for controlling a coupling of two or more coupling lines included in one of the coupling line groups T0/T1 and B0/B1 and a predetermined main signal (FD) input terminal and controlling a coupling of two or more coupling lines included the other of the coupling line group T0/T1 and B0/B1 and a predetermined sub signal (FDB) input terminal, in response to the input operation control signal FUSESEL.

For example, it may be seen that the input control block 450 shown in FIG. 4 couples two coupling lines included in the first coupling line group T0/T1 to the predetermined sub signal (FDB) input terminal and couples two coupling lines included in the second coupling line group B0/B1 to the predetermined main signal (FD) input terminal in response to the input operation control signal FUSESEL. In other words, the input control block 450 shown in FIG. 4 includes four NMOS transistors MN4 to MN7. Two NMOS transistors MN5 and MN7 have drain terminals coupled with the coupling lines included in the first coupling line group T0/T1, respectively, source terminals coupled with the predetermined sub signal (FDB) input terminal, and gate terminals receiving the input operation control signal FUSESEL. Two NMOS transistors MN4 and MN6 have drain terminals coupled with the coupling lines included in the second coupling line group B0/B1, respectively, source terminals coupled with the predetermined main signal (FD) input terminal, and gate terminals receiving the input operation control signal FUSESEL.

As shown in FIG. 5, the NMOS transistors MN4, MN5, MN6 and MN7 included in the input control block 450 are not only disposed close to the NMOS transistors MN0, MN1, MN2 and MN3 included in the transistor groups 410, 420, 430 and 440 but also have similar coupling shapes to each other. Therefore, the NMOS transistors MN4, MN5, MN6 and MN7 included in the input control block 450 are generally formed in the same active region as the NMOS transistors MN0, MN1, MN2 and MN3 included in the transistor groups 410, 420, 430 and 440.

FIGS. 4 and 5 show that the initialization control block 460 is disposed adjacent to the PMOS transistors MP0, MP1, MP2 and MP3 included in the transistor groups 410, 420, 430 and 440, and the input control block 450 is disposed adjacent to the NMOS transistors MN0, MN1, MN2 and MN3 included in the transistor groups 410, 420, 430 and 440. However, this is merely an example for describing the inventive concept disclosed herein, and an opposite configuration may be included in the scope of the present invention.

Although it is described in the embodiments of the present invention that signals are stored in the DICE latch through four coupling lines T0, B0, T1 and B1, signals may be stored through more even-numbered coupling lines such as 6 coupling lines and 8 coupling lines, depending on how to design circuit. When the number of the coupling lines increases to 6 or 8, transistor groups may be further included to invert the signals between the coupling lines.

In the aforementioned structure, the operation of the charge buffer block 470 for slowing do n charge movement speed in the line transmitting the initialization operation control signal RSTB means that a logic level of the initialization operation control signal RSTB is prevented from transitioning although a charge is instantly supplied to the line transmitting the initialization operation control signal RSTB. In other words, when the DICE latch is exposed to radiation and electric charges are generated to exceed a threshold charge amount in the coupling node included in one of the transistor groups 410 to 440, the excess electric charges may spread to the line transmitting the initialization operation control signal RSTB since it is disposed in the active region of the transistor groups 410 to 440. At this time, the charge may be instantly supplied to the line transmitting the initialization operation control signal RSTB. Therefore, the charge buffer block 470 may prevent a logic level of the initialization operation control signal RSTB from transitioning even when a soft error occurs in the DICE latch.

In accordance with the embodiments of the present invention, although a soft error occurs in a coupling line of a DICE latch storing signals through four or more coupling lines which are inverted and driven alternately with each other, the speed of remaining charges, which are caused by soft errors and spread to signal lines having a direct influence on operations of the DICE latch, may decrease. Consequently, inversion of the memory state may be prevented from occurring in the coupling lines although a soft error occurs.

While the present invention has been described with respect to specific embodiments, the embodiments are not intended to be restrictive, but rather descriptive. Further, it is noted that the present invention may be achieved in various ways through substitution, change, and modification by those skilled in the art without departing from the scope of the present invention as defined by the following claims.

Also, dispositions and types of the logic gates and transistors described in the aforementioned embodiments may be implemented differently based on the polarity of the inputted signal.

What is claimed is:
1. An integrated circuit, comprising:
   a latch block suitable for storing a signal through four or more even-numbered coupling lines inverted and driven alternately with each other, wherein the coupling lines are divided into two or more coupling line groups each including coupling lines inverted and driven to the same logic level;

a charge buffer block; and an initialization control block suitable for coupling two or more coupling lines included in the one of the coupling line groups with a power supply voltage terminal or a ground voltage terminal in response to an initialization operation control signal, wherein the latch block includes four or more even-numbered transistor groups each including a PMOS transistor and a NMOS transistor which are coupled in series with each other on both sides of a coupling node between the power supply voltage terminal and the ground voltage terminal, wherein the four or more even-numbered coupling lines couple the transistor groups with each other in a loop shape and each couples a coupling node of one of the transistor groups with a gate of an NMOS transistor of a front transistor group thereof and a gate of a PMOS transistor of a back transistor group thereof, wherein the initialization control block includes two or more first PMOS transistors having drain terminals respectively coupled with the two or more coupling lines included in the one of the coupling line groups, source terminals coupled with the power supply voltage terminal, and gate terminals receiving the initialization operation control signal, wherein the charge buffer block is coupled with the gate terminals of the first PMOS transistors included in the initialization control block in common and slows down charge movement speed in a line where the initialization operation control signal is transmitted, wherein the charge buffer block includes a second PMOS transistor in a capacitor form and having a gate terminal coupled with the gate terminals of the first PMOS transistors included in the initialization control block, and a source terminal and a drain terminal coupled with the power supply voltage terminal.

2. The integrated circuit of claim 1, wherein the first PMOS transistors included in the initialization control block and the second PMOS transistor included in the charge buffer block are formed in the same active region as PMOS transistors included in the four or more even-numbered transistor groups.

3. The integrated circuit of claim 1, wherein the charge buffer block includes:

a capacitor with a side coupled with the gate terminals of the first PMOS transistors included in the initialization control block and a other side coupled with the power supply voltage terminal.

4. The integrated circuit of claim 3, wherein the first PMOS transistors included in the initialization control block and the capacitor included in the charge buffer block are formed in the same active region as PMOS transistors included in the four or more even-numbered transistor groups.

5. The integrated circuit of claim 1, wherein the charge buffer block is coupled to an input line of the initialization operation control signal to the initialization control block and slows down charge movement speed thereof.

6. An integrated circuit, comprising:

a latch block suitable for storing a signal through four or more even-numbered coupling lines inverted and driven alternately with each other, wherein the coupling lines are divided into two or more coupling line groups each including coupling lines inverted and driven to the same logic level;

a charge buffer block; and an initialization control block suitable for coupling two or more coupling lines included in the one of the coupling line groups with a power supply voltage terminal or a ground voltage terminal in response to an initialization operation control signal, wherein the initialization control block includes two or more first PMOS transistors having drain terminals respectively coupled with the two or more coupling lines included in the one of the coupling line groups, source terminals coupled with the power supply voltage terminal, and gate terminals receiving the initialization operation control signal, wherein the charge buffer block is coupled with the gate terminals of the first PMOS transistors included in the initialization control block in common and slows down charge movement speed in a line where the initialization operation control signal is transmitted, wherein the charge buffer block includes a second PMOS transistor having a capacitor form and having a gate terminal coupled with the gate terminals of the first PMOS transistors included in the initialization control block, and a source terminal and a drain terminal coupled with the power supply voltage terminal.

7. The integrated circuit of claim 6, wherein the latch block includes four or more even-numbered transistor groups each including a PMOS transistor and a NMOS transistor which are coupled in series with each other on both sides of a coupling node between the power supply voltage terminal and the ground voltage terminal, and wherein the four or more even-numbered coupling lines couple the transistor groups with each other in a loop shape and each couples a coupling node of one of the transistor groups with a gate of an NMOS transistor of a front transistor group thereof and a gate of a PMOS transistor of a back transistor group thereof.

* * * * *